(12) United States Patent
Vadhavkar et al.

(10) Patent No.: US 10,916,527 B2
(45) Date of Patent: *Feb. 9, 2021

(54) APPARATUSES AND METHODS FOR SEMICONDUCTOR DIE HEAT DISSIPATION

(71) Applicant: Micron Technology, Inc., Boise, ID (US)

(72) Inventors: Sameer S. Vadhavkar, Boise, ID (US); Xiao Li, Boise, ID (US); Anilkumar Chandolu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/934,924

(22) Filed: Jul. 21, 2020

(65) Prior Publication Data

US 2020/0350294 A1  Nov. 5, 2020

Related U.S. Application Data

(60) Continuation of application No. 16/459,394, filed on Jul. 1, 2019, now Pat. No. 10,770,435, which is a continuation of application No. 16/272,190, filed on Feb. 11, 2019, now Pat. No. 10,461,061, which is a division of application No. 14/626,575, filed on Feb. 19, 2015, now Pat. No. 10,541,229.

(51) Int. Cl.
*H01L 25/065* (2006.01)
*H01L 23/367* (2006.01)

(52) U.S. Cl.
CPC ........ *H01L 25/0657* (2013.01); *H01L 23/367* (2013.01); *H01L 2225/06589* (2013.01); *H01L 2924/16235* (2013.01); *H01L 2924/16251* (2013.01)

(58) Field of Classification Search
None
See application file for complete search history.

(56) References Cited

U.S. PATENT DOCUMENTS

| | | | |
|---|---|---|---|
| 6,856,015 B1 * | 2/2005 | Huang | H01L 21/4882 257/704 |
| 8,526,186 B2 * | 9/2013 | Yokoya | H01L 23/49827 361/719 |
| 9,070,656 B2 | 1/2015 | Hooper et al. | |
| 2007/0126116 A1 * | 6/2007 | Dangelo | B82Y 10/00 257/720 |
| 2012/0205792 A1 | 8/2012 | Sugaya | |
| 2013/0188319 A1 * | 7/2013 | Yamaguchi | H01L 23/367 361/717 |
| 2014/0291825 A1 | 10/2014 | Yoneyama et al. | |
| 2015/0206820 A1 | 7/2015 | Standing | |

(Continued)

*Primary Examiner* — Ali Naraghi
(74) *Attorney, Agent, or Firm* — Dorsey & Whitney LLP

(57) ABSTRACT

Apparatuses and methods for semiconductor die heat dissipation are described. For example, an apparatus for semiconductor die heat dissipation may include a substrate and a heat spreader. The substrate may include a thermal interface layer disposed on a surface of the substrate, such as disposed between the substrate and the heat spreader. The heat spreader may include a plurality of substrate-facing protrusions in contact with the thermal interface layer, wherein the plurality of substrate-facing protrusions are disposed at least partially through the thermal interface layer.

19 Claims, 5 Drawing Sheets

(56) References Cited

U.S. PATENT DOCUMENTS

| | | |
|---|---|---|
| 2015/0262902 A1 | 9/2015 | Shen et al. |
| 2016/0005717 A1 | 1/2016 | Lin et al. |
| 2016/0035648 A1 | 2/2016 | Zhou et al. |
| 2016/0247742 A1 | 8/2016 | Vadhavkar |
| 2019/0172817 A1 | 6/2019 | Vadhavkar et al. |
| 2019/0326260 A1 | 10/2019 | Vadhavkar et al. |

\* cited by examiner

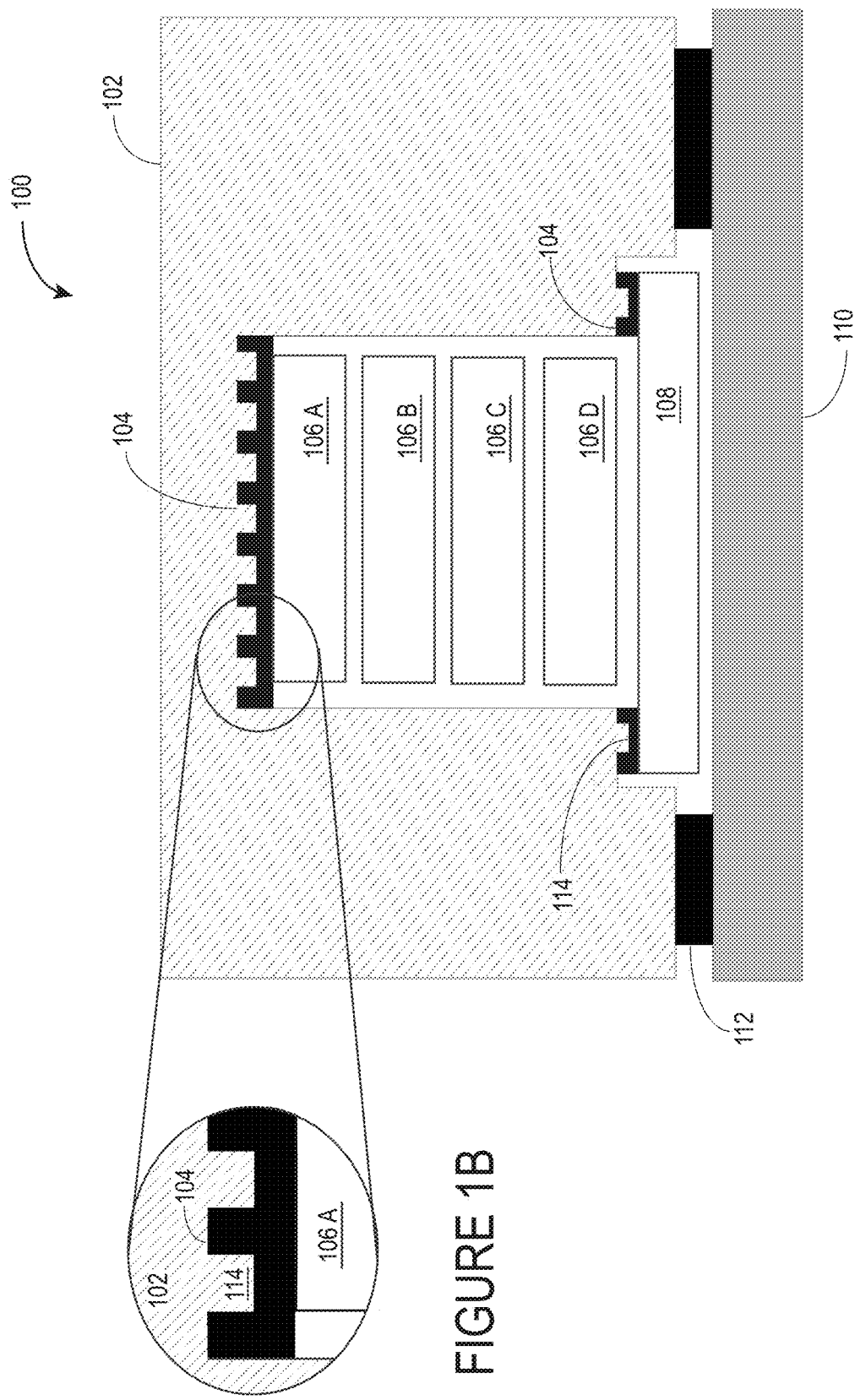

APPARATUSES AND METHODS FOR SEMICONDUCTOR DIE HEAT DISSIPATION

CROSS REFERENCE TO RELATED APPLICATION(S)

This application is a continuation of U.S. application Ser. No. 16/459,394, filed Jul. 1, 2019, U.S. Pat. No. 10,770,435 issued Sep. 8, 2020, which is a continuation of U.S. application Ser. No. 16/272,190 filed Feb. 11, 2019, U.S. Pat. No. 10,461,061 issued on Oct. 29, 2019, which is a divisional of U.S. patent application Ser. No. 14/626,575 filed Feb. 19, 2015, U.S. Pat. No. 10,541,229 issued on Jan. 21, 2020. The aforementioned applications and patents are incorporated herein by reference, in their entirety, for any purpose.

BACKGROUND

The evolution of electronics is forcing component manufacturers to develop smaller devices while providing greater functionality and speed. The combination of these size and operational goals may lead to increases in internal heat generation. The increase in heat generation may be due to obstructed or inefficient thermal paths in combination with higher operating power consumption. For the components to continue to provide the performance desired, the extra heat may need to be dissipated. At a time when components (and the systems including the components) were larger, dissipation of any extra heat may have been more easily accomplished due to heat dissipating bulk materials and/or the air flow around the components. Currently, however, small, high powered devices and components containing multiple co-packaged die may benefit from packaging that provides higher thermal conductivity paths for dissipating the heat generated within such devices.

BRIEF DESCRIPTION OF THE DRAWINGS

FIG. 1A is an example illustration of a heat spreader and semiconductor die stack combination according to the present disclosure.

FIG. 1B is an example illustration of a die, thermal interface layer, heat spreader relationship according to the present disclosure.

DETAILED DESCRIPTION

Figure 2B:
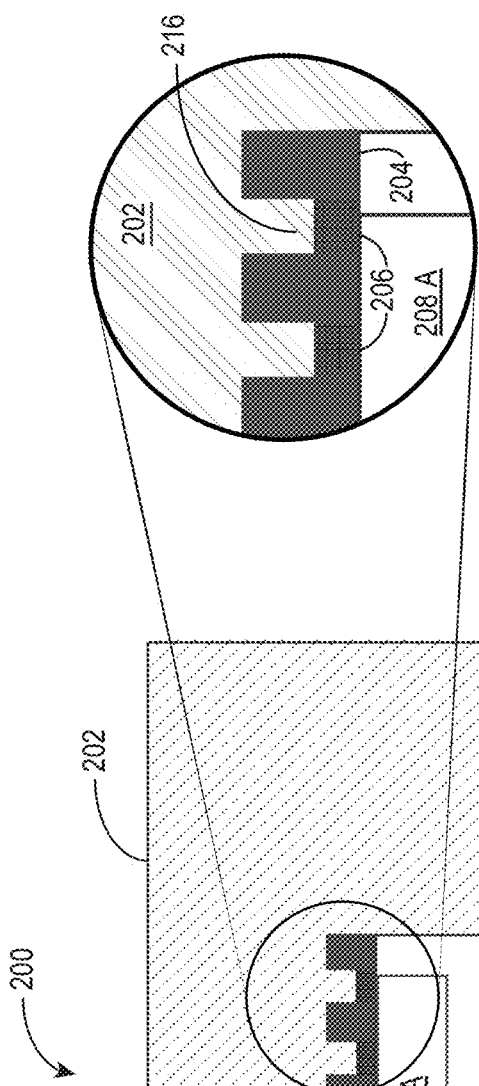
FIG. 2B is another example illustration of a die, thermal interface layer, and heat spreader relationship according to the present disclosure.

Apparatuses and methods for heat extraction from packaged semiconductor devices are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As noted, thermal management of semiconductor devices is an ever increasing concern and due in part to combinations of device size and power consumption. Other factors may also contribute to thermal concerns, such as multiple die packaged together for example. Heat extraction barriers such as multiple interfaces may contribute to the problems of multiple co-packaged die. At elevated operating levels, the overall heat generated by multiple co-packaged die may increase. Such an increase in heat generation may be due to the proximity of several co-packaged die exacerbating heat conduction and adding to an operating environment at an elevated temperature. For example, a co-package stack of die may present a difficult heat extraction configuration due to the multiple interfaces the heat may need to travel before reaching an external surface of the package for dissipation. Additionally, lateral heat extraction may also be limited due to die packaging configurations. The additional heat, if not efficiently removed from the stack of die, may cause one or more die in the stack to experience temperatures above their specified limits. Such thermal problems may lead to malfunctioning or inoperable devices.

Packaging may play a role in enhancing heat extraction. Heat sinks may be added to packaging in an effort to dissipate heat more efficiently. Packaging materials may be designed to have increased thermal conductivity characteristics aimed at improving heat dissipation. These packaging materials may include metal fillers to improve thermal conductivity, for example. Most of these approaches, however, may be more focused external to the package or minimally related to the package itself. More package-centric approaches may focus on supplying heat conduction paths from die to package, but these approaches may be limited by the material used for the die and package or space limited.

In the case of a multi-die package, for example, the extraction of heat may be inhibited due to the many interfaces through which the heat may need to travel. The interfaces may impede the flow of heat in directions perpendicular to the die surface, but may also impede planar heat flow within a die. The interfaces may be due to die fabrication, e.g., many layers of metal and passivation layers built up on an active surface of the die, and/or to the die being stacked, e.g., multiple die stacked on top of one another. The interfaces may cause the heat flow to be reduced due to reflection and the materials of the die may reduce heat flow due to variations in thermal conductivity. Further, the distance from a heat generating source, e.g., an active area of a die, to a heat-dissipating packaging surface may also reduce heat dissipation. Moreover, low thermal conductivity of the various package materials may also adversely affect heat dissipation.

One solution to increase the heat extraction from a co-packaged die stack may be to package the die stack with a conformal heat spreader that includes internally-facing protrusions. The internally-facing protrusions may be in close proximity to and/or touching one or more die in the die stack. The internally-facing protrusions may be die stack facing and may provide for increased heat spreader surface area to provide an improved thermal path. The internally-facing protrusions may contact or be in close proximity to the top die of the stack and to one or more other die of the stack, such as the bottom die. The reduced distance from the die surface to a bottom surface of each of the protrusions may provide improved thermal pathways from the die to the package/heat spreader. A bottom surface of the protrusions along with sides of the protrusions may reduce the distance through which heat may travel from the die surface to the heat spreader. The reduced distance between the die surface and heat spreader may include a small volume (e.g., a thin layer) of a thermal interface material that is formed between the heat spreader and the die. An alternative solution may involve the protrusions of the heat spreader contacting or coming into close proximity to thermal dissipation pads formed on the backside of one or more die of the die stack. The "backside" of the die may be a face of the die opposite a face of the die that includes the active elements, e.g., transistors and logic gates, which may be referred to as the "front side" of the die. The thermal dissipation pads may further enhance heat dissipation of the die stack.

FIG. 1A is an example illustration of a heat spreader and semiconductor die stack combination 100 according to the present disclosure. The combination 100 may represent a semiconductor die stack packaged with a heat spreader. In some embodiments, the heat spreader may be a conformal lid. The combination 100 may include a heat spreader 102, a plurality of semiconductor die 106 A-D, a semiconductor die 108, and a base 110, which may be configured to enhance thermal dissipation of the stack of die 106 A-D and 108. The heat spreader 102 may include die-facing protrusions that may allow for increased dissipation of heat from one or more of the die 106 A-D and/or 108. The base 110 may be a printed circuit board (PCB) or a base of a semiconductor package, for example. The base 110 is a non-limiting aspect of the present disclosure, and any type of base would fall within the scope of the present disclosure. The heat spreader 102 may be connected to the base 110 by adhesion bonds 112. The combination 100 may be included in any electronics host system such as portable electronics, smartphones, laptop computers, desktop computers, etc. In one non-limiting example, the combination 100 may be a memory module including multiple semiconductor memory die and an interface die.

In a non-limiting example, each of the plurality of die 106 A-D may be a memory die, such as non-volatile or volatile memory die. The die 108 may be an interface die or a logic die. The stack of die, including the plurality of die 106 A-D and the die 108, may be interconnected with through-via interconnects (not shown), which may be a common bus for command and data signals to propagate within the stack of die. The command and data signals may be externally provided to the stack of die by the host and data may be provided to the host in response. Additionally, the die 108 may receive data and command signals from one or more external components, and in response provide the data/command signals to a target die 106 of the plurality of die 106 A-D.

In the example shown in FIG. 1A, the die 108 is depicted as being larger than the die 106 and this depiction may be for illustrative purposes only and is non-limiting. The difference in size may be due to various functions the die 108 performs and the respective circuits used for such functions. The die 108 may include logic circuits and communication circuits, which may generate heat due to the power levels at which the die operates. Heat generated by the die 108, especially if generated directly under the die 106 D, may be difficult to dissipate. The difficulty in dissipation may be due to the distance from a heat generating area of the die 108 and a path taken by the heat from heat generating area to the heat spreader 102. In general, heat generated by any or all of the plurality of die 106 A-D and 108 may be difficult to extract due to the various interfaces and paths the heat must travel from a respective die to the heat spreader 102.

The combination 100 may further include a thermal interface layer 104 disposed between the die 106 A, exposed edges of the die 108 and the heat spreader 102. The thermal interface layer 104 may be included to assist with heat transfer from the die stack to the heat spreader 102, and may also assist in mounting, e.g., attaching, the heat spreader 102 to the die stack. The thermal interface layer 104 may be an epoxy material that may or may not include metal fillers, such as indium or gallium. The metal fillers may be included to enhance thermal conduction, and may be indium or gold. The thickness of the thermal interface layer 104 may be from 20 to 50 microns, which may be dependent upon fabrication process and/or due to normal variations in the fabrication process. The thermal interface layer 104 may have a thermal conductivity rating of 2 W/mK to 10 W/mK, and the variation in thermal conductivity may be due to the presence, or lack thereof, of the filler materials present.

As discussed above, one solution to the problem of dissipating heat from a stack of semiconductor die may include decreasing a distance from a heat sink to a surface of a die. An example embodiment of the solution may involve adding a plurality of protrusions 114 to the heat spreader 102. The plurality of protrusions may be internally-facing, e.g., die-facing, such as depicted by the protrusions 114 shown in FIG. 1A. The protrusions 114 may be partially or fully disposed within, e.g., embedded into and/or extending through, the thermal interface layer 104 such that a bottom face of one or more of the protrusions 114 are in close proximity to the top of the die 106 A and the exposed portions of the die 108. To further illustrate, if the thermal interface layer 104 is 50 microns thick, then a bottom face of one or more protrusions 114 disposed into the thermal interface layer may be substantially proximate to the surface of the die, e.g., within 10 microns or less of the die surface. In this configuration, the thickness of the thermal interface layer 104 between the surface of a protrusion and the die surface is less relative to the 50 micron thickness of the thermal interface layer 104 present in the spaces between the protrusions 114. As such, there may be a reduction in volume of the thermal interface layer 104 between the protrusions 114 and the die 106 A and/or the exposed portions of the die 108. This decrease in volume of the thermal interface layer 104 may improve the heat path, e.g., reduce the amount of the thermal interface layer 104 the heat must travel before reaching the heat spreader 102. Additionally or alternatively, the bottom surface of one or more of the protrusions 114 may make direct, physical contact with the top of the die 106 A and/or the exposed portions of the die 108. In either configuration, e.g., one or more protrusions in direct contact with or in close proximity to a top of the die 106 A, however, heat generated within the stack of die 106, 108 may be provided an enhanced thermal conduction path to the heat spreader 102 due to the proximity of the protrusions 114 to the die 106 A and/or the exposed portions of the die 108.

As heat moves from the stack of die 106 A-D and the die 108 to the heat spreader 102, the areas of the die 106 A and the exposed portions of the die 108 under one or more of the protrusions 114 may be characterized as having increased thermal conductivity due to the reduction of the thermal interface layer 104 under the protrusions 114/heat spreader 102. Increased thermal conductivity may also be obtained when one or more of the protrusions 114 are in contact with the die 106A or the die 108. Thus, either or both situations— protrusions in close proximity to or in contact with a die surface—may provide enhanced heat dissipation for the combination 100.

Thermal dissipation provided by the heat spreader 102 may further be enhanced due to increased surface area of the underside of the heat spreader 102 facing the stack of die 106, 108. The protrusions 114, for example, may be pillars protruding from the underside of the heat spreader 102, with each pillar having a bottom surface and one or more side surfaces, e.g., rectangular pillars or round pillars. The bottom surface of each pillar, as discussed above, may either be in contact with a die surface or in close proximity to the die surface such that a volume of the thermal interface layer is reduced between the die and pillar surface. The sides of each pillar may further improve the heat dissipation due to the increased surface area they provide for heat extraction by the heat spreader 102.

FIG. 1B is an example detailed view of a die, thermal interface layer, and heat spreader according to the present disclosure. The detailed view may include the heat spreader 102, one or more protrusions 114, the thermal interface layer 104, and the die 106 A. The thermal interface layer 104 is depicted to fill the space present between the die 106 A and the heat spreader 102. Due to the protrusions 114, the thermal interface layer 104 may be thinner, e.g., less volume, between the protrusions 114 and the die 106 A than in the spaces between the protrusions 114. Due to potential limitations of the thermal conductivity of the thermal interface layer 104, the protrusions 114 are designed to be disposed in, e.g., extend into or through, the thermal interface layer so that they are in close proximity to and/or in connection with a surface of the die 106A and the die 108. The reduced volume of the thermal interface layer in these areas may increase heat dissipation by providing an improved heat path between the die and the heat spreader 102. An improved heat path may be characterized as a reduction in distance heat may need to travel in a low thermal conductivity material, for example, the heat spreader 102.

The interface between the protrusions 114 and the die 106 A depicted in FIG. 1B (and FIG. 1A) is shown to include a layer of the thermal interface layer 104 between the two components. Other orientations, however, are also contemplated by the present disclosure. For example, one or more protrusions 114 of the heat spreader 102 may be in contact with the die 106A such that virtually no thermal interface layer 104 is present between the two components. Direct connection may further enhance heat dissipation. The detailed view shown in FIG. 1B in relation to a die 106A may also be descriptive of the relationship between the heat spreader, thermal interface layer, and die 108.

Figure 2A:
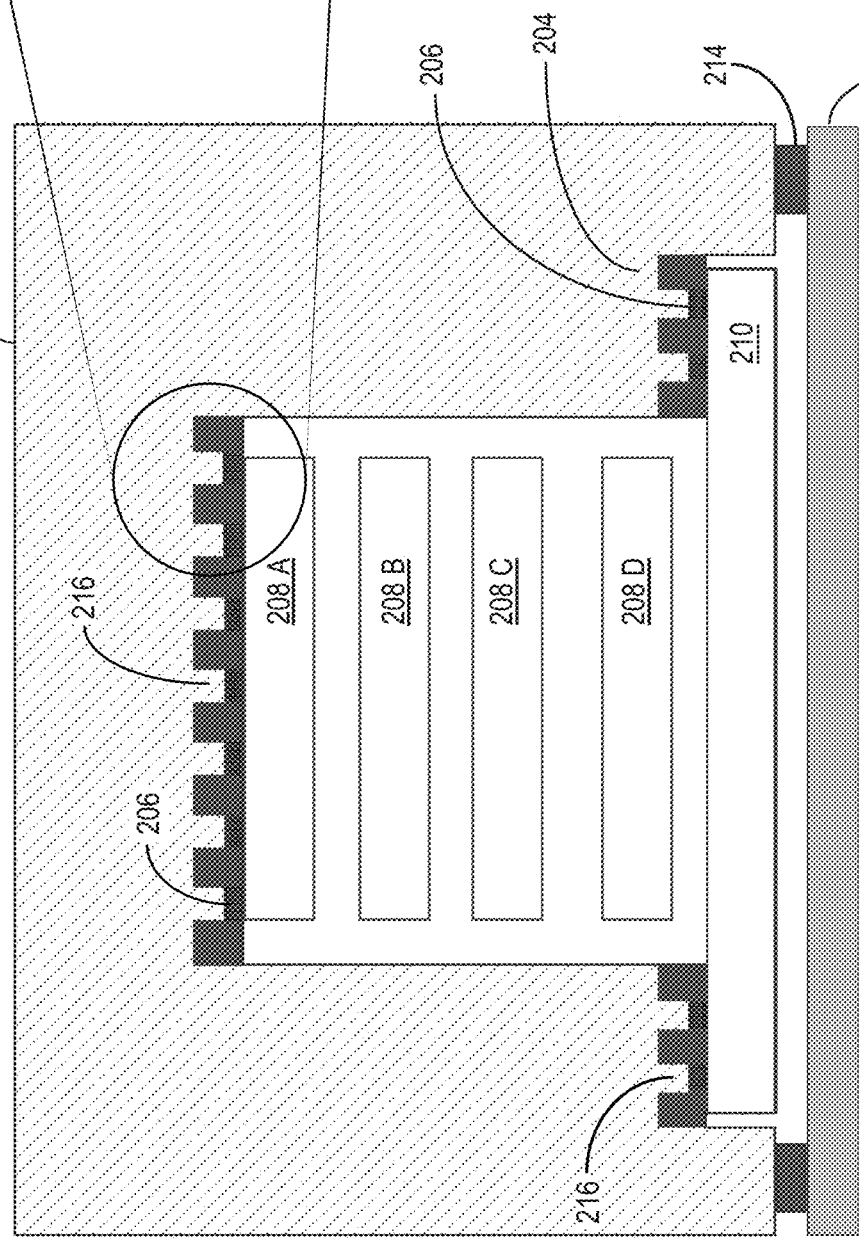
FIG. 2A is another example illustration of a heat spreader and semiconductor die stack combination according to the present disclosure

FIG. 2A is an example illustration of a heat spreader and semiconductor die stack combination 200 according to the present disclosure. The combination 200 may include many of the same features as does the combination 100 of FIG. 1A, but differ in certain aspects. For example, the dies 208 A-D and the die 210 may include thermal dissipation pads 206, which may enhance thermal path dissipation of the stack of die 208 A-D and 210. The thermal dissipation pads may allow for increased dissipation of heat from one or more of the die 208A-D, and/or the die 210.

Similar to the heat spreader 102 of FIG. 1A, the heat spreader 202 may include a plurality of protrusions 216. The plurality of protrusions 216 may form an array or grid of protrusions on the underside, e.g., the surface of the heat spreader 202 facing the stack of die 208. The protrusions 216 may also be described as internally-facing since they extend internal to the combination 200 instead of external, as many heat sinks are designed. The die 208 A, and the die 210 may include a plurality of thermal dissipation pads 206, which may be laid out in a grid pattern on a top surface of at least those two die, e.g., the surface of the die 208 A facing the heat spreader 202 as depicted in FIG. 2A. The dies 208 A-D, 210 may also include a plurality of through-via conductors and associated bonding pads located on both top and bottom surfaces of the die (not shown), where the bonding pads may be on the surfaces of the die 206A and the die 210 facing the heat spreader 202. The bonding pads associated with the plurality of through-via conductors may be arranged in periodic columns and/or rows, and it maybe desirable for the through-via conductors to not make contact with any of the protrusions 216. Contact with any of the protrusions 216 by any of the through-via bonding pads may short circuit at least part of the stack of die 208 A-D, 210. The heat spreader 202 may be designed so that the plurality of protrusions 216 align with or make contact to one or more of the thermal dissipation pads 206 while avoiding the bonding pads for the through-via conductors.

The protrusions 216 may be in close proximity to one or more thermal dissipation pads 206 so that a reduced volume of the thermal interface layer 204 is disposed between one or more of the protrusions 216 and one or more of the thermal dissipation pads 206. Alternatively or additionally, one or more of the protrusions 216 may make direct, physical contact with one or more thermal dissipation pads 206. FIG. 2A depicts a one-to-one relationship between a protrusion 216 and a thermal dissipation pad 206, which may be shown for clarity of discussion. Other relationships, however, may also fall within the scope of the present disclosure. For example, a protrusion 216 may be in close proximity to or in direct contact with more than one thermal dissipation pad 206. Moreover, a bottom face of a protrusion 216 may be in close proximity to or in direct contact with a small array or a plurality of thermal dissipation pads 206.

The connection between one or more protrusions 216 and one or more thermal dissipation pads 206 may be either direct physical contact due to proximity or a metallic bond may be formed between the two. The thermal dissipation pads 206 may be coated with or formed from one or more metals. The one or more metals may be a metal stack that includes copper, nickel, and gold or palladium, for example. The protrusion-side of the heat spreader 202 may be similarly coated. A eutectic bond may then be formed between one or more of the thermal dissipation pads 206 and one or more of the protrusions 216 by subjecting the combination 200 to one or more heat treatments and or re-flow processes. The eutectic bond may further improve heat dissipation of the combination 200.

Thermal dissipation may improve whether or not one or more of the thermal dissipation pads 206 and one more of the protrusions 216 are in direct physical contact. For example, a reduction in volume of the thermal interface layer 204 between a protrusion 216 and a thermal dissipation pad 206 may provide improved thermal dissipation. The improved thermal dissipation may be due, at least in part, to an improved heat dissipation path between the die 208 A, and/or the die 210 and the heat spreader 202. Additionally, there may be embodiments where a subset of the plurality of protrusions 216 are in contact with one or more thermal dissipation pads 206 while other protrusions are in close proximity to one or more thermal dissipation pads 206.

FIG. 2B is an example detailed view of a die, thermal interface layer, and heat spreader according to the present disclosure. The detailed view includes the die 208 A, thermal dissipation pads 206, the thermal interface layer 204, and protrusions 216 of the heat spreader 202. The detailed view may also represent the relationship between the designated components in relation to the edges of the die 210. The detailed view depicts the protrusions 216 and the thermal dissipation pads 206 as being in contact, e.g., direct physical contact. As noted, other proximate relationships may exist between the protrusions 216 and the thermal dissipation pads 206, and all variations fall within the scope of the present disclosure. For example, a thin layer of the thermal interface layer 204 may be disposed between a protrusion 216 and a thermal dissipation pad 206. Additionally, proximity of a protrusion to a thermal dissipation pad may be subject to variations due to variations in the fabrication of the thermal dissipation pads, the heat spreader protrusions, the mounting process or combinations thereof.

Figure 3:
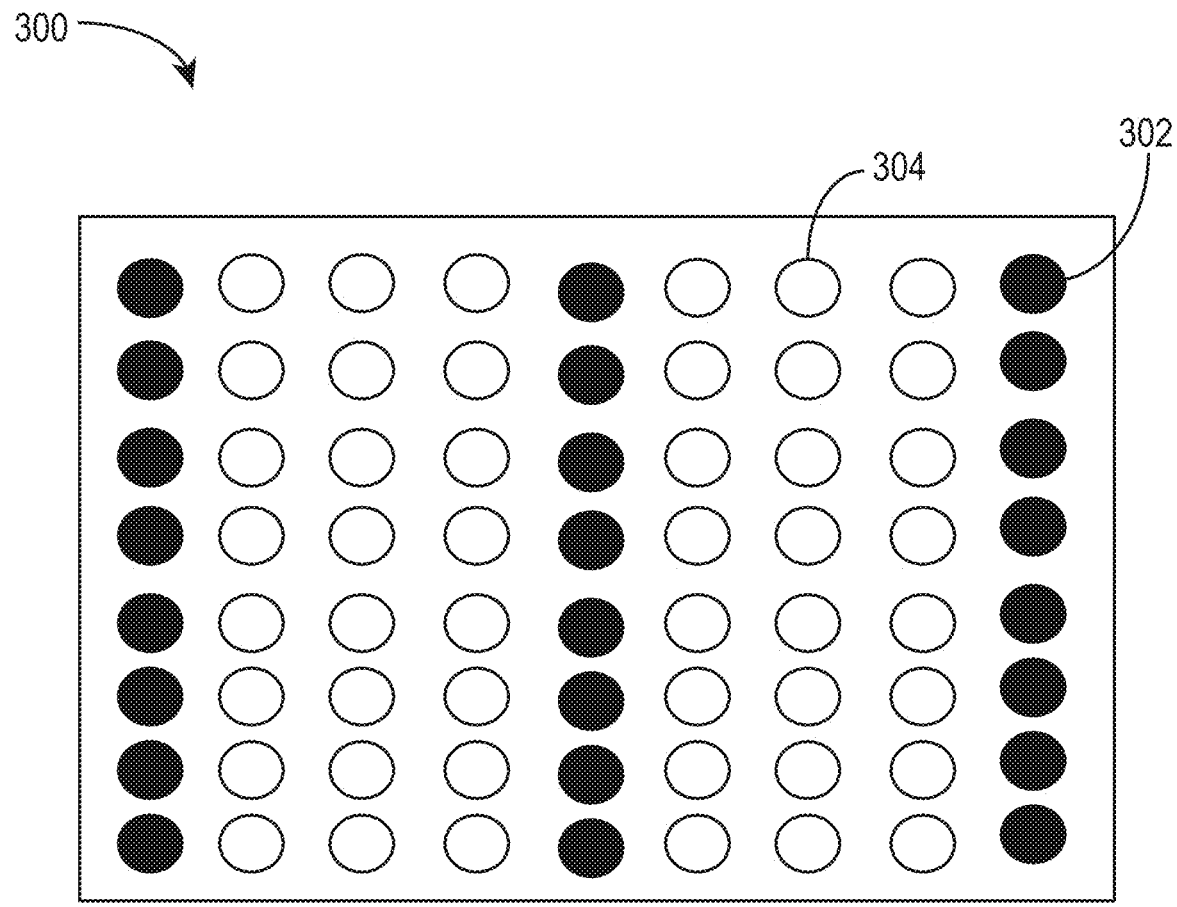
FIG. 3 is an example illustration of a die according to the present disclosure.

FIG. 3 is an example illustration of a die 300 according to the present disclosure. The illustration of FIG. 3 may depict a back or top of a die. The die 300 may, for example, be used as one of the die 208 A-D, such as the die 208 A in the stack depicted in FIG. 2. The die 300 may also be an example of the die 210 of FIG. 2. The die 300 may have an array of bonding pads formed on one surface, the backside surface of the die 300 for example. The front side surface of the die 300 (not shown) may include the active region of the die, which may include circuits such as transistors and logic gates. The array of bonding pads may include periodic columns of through-via bonding pads 302 along with a plurality of the thermal dissipation pads 304. The through-via bonding pads 302 are shown in FIG. 3 as darkened circles and the thermal dissipation pads 304 are shown as unfilled circles. The through-via bonding pads 302 may provide electrical connections to the front side surface of the die 300 from the backside surface. Further, multiple die may be stacked on top of one another and the through-via bonding pads 302 (along with through-via conductors) allow for the stack of die to be electrically interconnected by a common data/command bus, for example. The thermal dissipation pads 304 may be disposed on a passivation layer coating the backside surface of the die 300, for example. The thermal dissipation pads 304 may provide thermal dissipation pathways in addition to structural support for a stack of die.

The thermal dissipation pads 304 may be formed from one or more metals, such as a stack of copper, nickel, and gold. In some examples, palladium is used instead of gold. The one or more metals used to form the thermal dissipation pads 304 may be similar to the one or more metals used to form the through-via bonding pads 302. The array pattern the bonding pads shown for the die 300 in FIG. 3 are for illustrative purposes only and any pattern falls within the scope of the present disclosure.

The layout of the thermal dissipation pads 304 and the through-via bonding pads 302 may determine a layout and design configuration for heat spreader protrusions. Because it may be desirable to avoid contact between heat spreader protrusions and through-via bonding pads 302, heat spreader protrusions may be designed so that one or more spaces between the protrusions align with the through-via bonding pads 302 when the heat spreader is mounted onto a stack of die, as depicted in FIG. 2A. With regards to the thermal dissipation pads 304, however, it may be beneficial for the heat spreader protrusions to correspond with one or more thermal dissipation pads after mounting. With the thermal dissipation pads 304 and heat spreader protrusions in alignment, the heat dissipation path for one or more die may be enhanced.

Figure 4A:
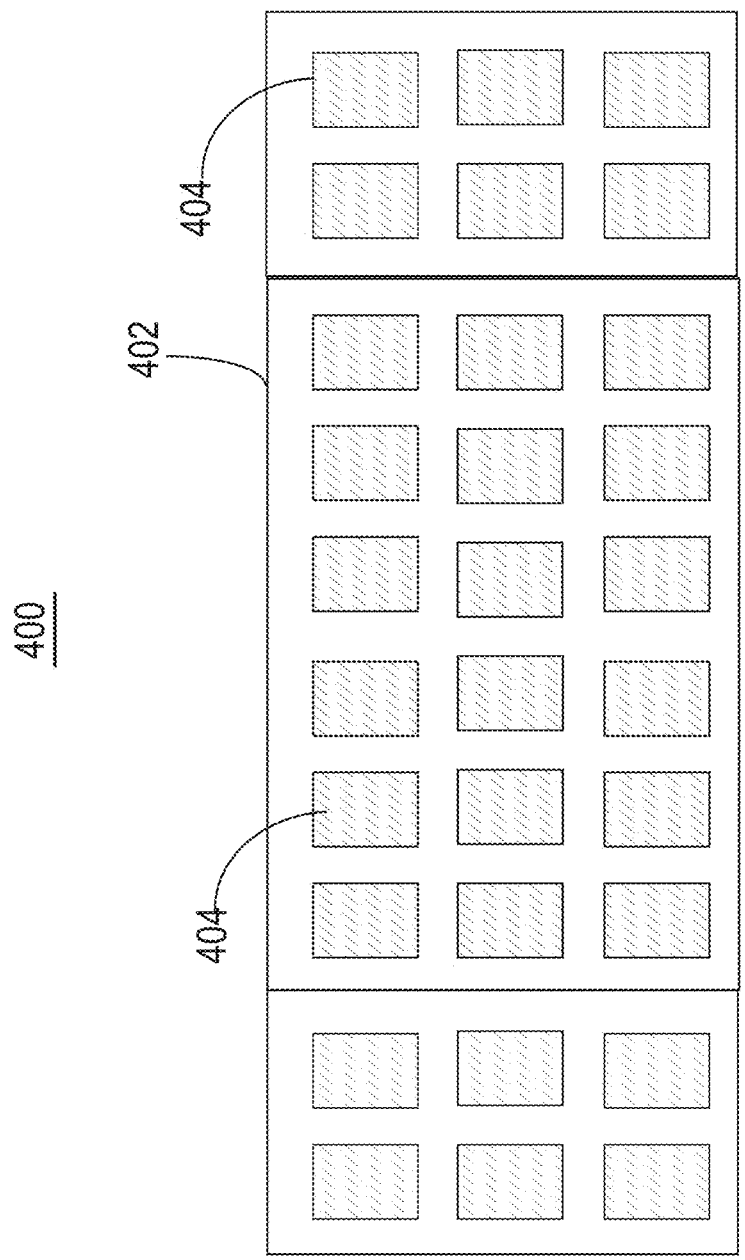
FIGS. 4A and 4B are example illustrations of a heat spreader according to the present disclosure.
Figure 4B:
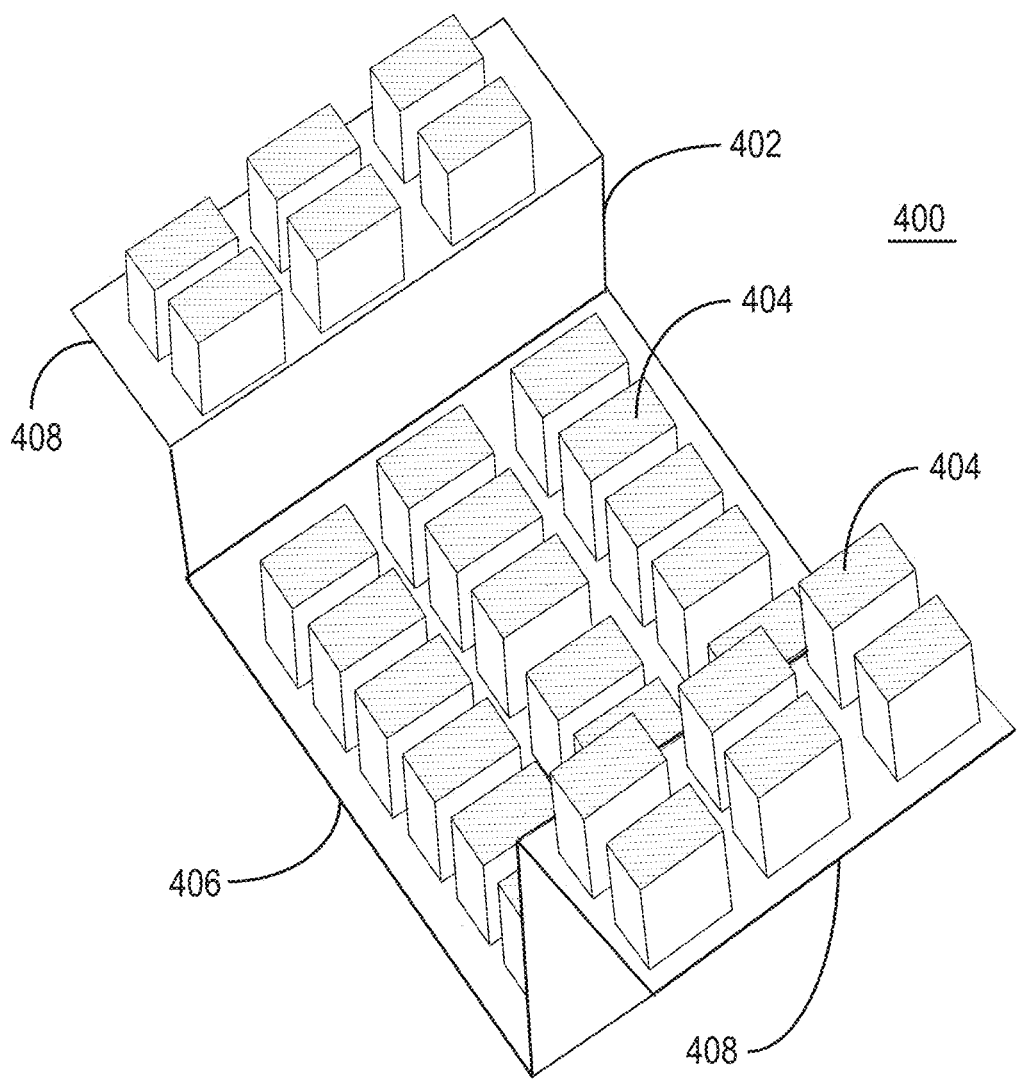

FIGS. 4A and 4B are illustrative examples of a heat spreader 400 according to the present disclosure. The heat spreader 400 may be an example of the heat spreader 102 of FIG. 1A and/or the heat spreader 202 of FIG. 2A. A view from the underside of the heat spreader 400 is shown in FIGS. 4A and 4B. The heat spreader 400 may be formed by a body 402 that may be U or horseshoe-shaped and that includes a plurality of protrusions 404. The plurality of protrusions 404 may be formed on the underside of the body 402 in the areas 406 and 408. By forming the protrusions 404 on the underside of the body 402, the protrusions may be internally or die facing, such as depicted in FIGS. 1A and 2A, when the heat spreader 400 is mounted on a die stack. The protrusions 404 are depicted as rectangular pillars, but any shape falls within the scope of the current disclosure. For example, the protrusions 404 may be cylindrical or triangular, e.g., prism-shaped. A bottom face of the protrusions 404 may be from 50 microns on a side to 0.5 mm on a side. The height of the protrusions may be similarly sized. The spacing between the protrusions may either be of similar dimensions or may be based on the pitch and size of an array of thermal dissipation pads. As such, each protrusion may be depicted as a small pillar formed on or from the body 402. Further, each protrusion may of a different shape and/or size, which may depend on a design of a die which a heat spreader 400 is to be mounted.

The number and shape of the protrusions may vary based on the design of the die that the heat spreader may be mounted upon, e.g., die with and without thermal dissipation pads. Further, the spacing between the die may also vary based on heat spreader size, die size/design, protrusion size, or combinations thereof. The size, shape, number, and layout of the protrusions, any of which fall within the scope of the present disclosure, may at least be driven by thermal dissipation improvement.

A thermal interface layer deposed between a die and a heat spreader, such as the thermal interface layers 104 and 204 of FIGS. 1A and 2A, respectively, may also influence the design of the heat spreader protrusions. Stress-induced delamination of the thermal interface layer may be a concern and may occur where the thermal interface layer thickness does not allow for stress relief due to the thickness being too thin to allow for deformation of the layer. Further, stress-induced delamination may occur at the edges of a thin film where the stress may be relieved by the thin film releasing from a substrate, the die surface for example, instead of deforming. To assist with stress relief, the protrusions may be offset from the very edge of a die so that the thermal interface layer at the edges is thick enough to allow for stress relief. Further stress relief may occur in the spaces between the protrusions where the thermal interface layer is thicker. As such, a plurality of protrusions may allow the thermal interface layer to relieve planar stress to reduce delamination within spaces between the protrusions.

Since the heat spreader 400 may also be a conformal lid for a stack of die, the heat spreader 400 may take the U-type shape as depicted in FIG. 4B. The U-type shape may be used so that the heat spreader 400 is in close proximity with or contact with the top die in a stack, such as the die 106A of FIG. 1, and so the ledges 408 are close to the exposed edges of a bottom die, such as the die 210 of FIG. 2A. Further, due to the lid conforming to the stack of die, the heat dissipation path is further reduced. Other mechanical and structural advantages may be obtained from the heat spreader 400, which would be clear to one skilled in the art. The U-type shape depicted in FIG. 4B shows protrusions located on area 406 of the body 402 and the ledges 408 of the body 402. The area 406, for example, may, after mounting the heat spreader 400 to a stack of die, align with a top die of a stack, such as the die 106A of FIG. 1A or the die 208A of FIG. 2A. The ledges 408 may align with the exposed regions of the die 108 of FIG. 1A or the die 210 of FIG. 2A.

The heat spreader 400 may be fabricated by various methods and the size of the protrusions may determine the method used for their fabrication. The U-type shape of the heat spreader 400 may be formed through a stamping process and the protrusions may be formed during the stamping process or by additional fabrication steps. For example, if the bottom surface of each of the protrusions are 0.5 mm on a side, then the heat spreader including the protrusions may be fabricated using a conventional metal stamping process. If, however, the protrusions 404 are smaller, around 50 microns on a side for example, then the heat spreader body 402 may be stamped and the protrusions 404 formed through masking and etching. Additionally, if eutectic bonds are to be formed with thermal dissipation pads, for example, then the heat spreader, or at least bottom face of the protrusions 404, may be coated with a metal, such as gold or tin. Tolerances and variations in the heat spreader 400 fabrication process may influence whether or not the protrusions 404 make contact with a die and/or a thermal dissipation pad of a die. The height of the protrusions may be designed to target contact, but protrusions that are shorter due to fabrication process variation may still be substantially close to the die and/or thermal dissipation pads to improve heat dissipation characteristics of the heat spreader 400.

The heat spreader 400 die mounting process may include dispensing a thermal interface layer material onto the top of the die stack, such as the top of the die 208A and the exposed edges of the die 210 of FIG. 2A, followed by pressing the heat spreader 400 down onto the die stack. The pressing of the heat spreader onto the die stack may cause the thermal interface layer material to flow into a thin layer that covers the die stack and which also fills the interstitial areas between the protrusions 404. If a eutectic bond between the protrusions and thermal dissipation pads is desired, then the combination of the die stack and heat spreader may be subjected to one or more heat treatments to form the bonds.

The die stacks depicted in FIGS. 1A and 2A are for illustrative purposes only and are not limiting. All possible variations in the number of die in the stack and the types of die in the stack are within the scope of the present disclosure. For example, an interposer die may be inserted between a die 108 and the bottom die 106, for example, which may provide further structural stability and thermal enhancement.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
   a substrate;
   a thermal interface layer disposed on a first surface of the substrate; and
   a heat spreader comprising a first surface comprising a plurality of substrate-facing protrusions in contact with the thermal interface layer, wherein a thickness of the thermal interface layer between the plurality of substrate-facing protrusions is greater than a thickness of the thermal interface layer at locations of the plurality of substrate-facing protrusions.

2. The apparatus of claim 1, wherein the substrate-facing protrusions are offset from an edge of the substrate.

3. The apparatus of claim 1, wherein the heat spreader comprises a U-type shape and a second surface and a third surface of the heat spreader are proximate to a second surface and a third surface of the substrate,
   wherein the second surface and the third surface of the heat spreader are parallel to one another and perpendicular to the first surface of the heat spreader, and wherein the second surface and the third surface of the substrate are parallel to one another and perpendicular to the first surface of the substrate.

4. The apparatus of claim 1, wherein the a face of a substrate-facing protrusion of the plurality of the substrate-facing protrusions measures between or including 50 microns to 0.5 millimeters on a side.

5. The apparatus of claim 1, wherein a height of a substrate-facing protrusion of the plurality of the substrate-facing protrusions measures between or including 50 microns to 0.5 millimeters.

6. The apparatus of claim 1, wherein the thermal interface layer comprises a plurality of thermal dissipation pads.

7. The apparatus of claim 6, wherein the plurality of thermal dissipation pads are arranged to correspond with locations of the plurality of substrate-facing protrusions.

8. The apparatus of claim 1, wherein the plurality of the substrate-facing protrusions are at least one of rectangular, triangular, or cylindrical.

9. An apparatus, comprising:
   a stack of semiconductor die, the stack of semiconductor die comprising a top die and a bottom die; and
   a heat spreader comprising:
      a first portion with a plurality of first protrusions;
      a first ledge with a plurality of second protrusions;
      a second ledge with a plurality of third protrusions,
      wherein the first ledge and the second ledge are coupled to the first portion by a body having a U-type shape such that the first portion of the heater spreader is proximate to a surface of the top die and the first and second ledges of the heat spreader are proximate to a surface of the bottom die.

10. The apparatus of claim 9, wherein a portion of the surface of the bottom die is covered by the stack of semiconductor die and the first ledge and the second ledge completely cover exposed portions of the surface of the bottom die.

11. The apparatus of claim 9, further comprising:
    a first thermal interface layer disposed between the heat spreader and the surface of the top die; and
    a second thermal interface layer disposed between the heat spreader and the surface of the bottom die.

12. The apparatus of claim 11, wherein the first thermal interface layer comprises a plurality of first indentations configured to receive the plurality of first protrusions, and wherein the second thermal interface layer comprises a plurality of second indentations configured to receive the plurality of second protrusions and the plurality of third protrusions.

13. The apparatus of claim 9, wherein a portion of the body coupling the first portion to the first ledge or the second ledge is adjacent to a side of the stack of semiconductor die.

14. A method comprising:
    performing a stamping process on a thermally conductive material to generate a heat spreader comprising a U-type shape body, wherein the heat spreader includes a first portion, a first ledge, and a second ledge, wherein the first portion is coupled to the first ledge and the second ledge by the U-type shape body;

forming a plurality of protrusions on the first portion, the first ledge, and the second ledge;
dispensing a thermal interface layer material onto a top of a die stack; and
pressing the heat spreader onto the die stack such that the plurality of protrusions are facing the die stack.

15. The method of claim 14, wherein forming the plurality of protrusions comprises:
masking a portion of a surface of the heat spreader;
etching a second portion of the surface of the heat spreader.

16. The method of claim 14, wherein forming the plurality of protrusions comprises performing the stamping process.

17. The method of claim 14, further comprising coating a face of individual ones of the plurality of protrusions with a metal.

18. The method of claim 17, wherein the metal comprises at least one of gold or tin.

19. The method of claim 14, further comprising forming eutectic bonds between the heat spreader and the thermal interface layer material by performing a heat treatment.

* * * * *